(12) United States Patent
Lu et al.

(10) Patent No.: US 8,163,584 B2
(45) Date of Patent: Apr. 24, 2012

(54) METHOD OF MINIMIZING BEAM BENDING OF MEMS DEVICE BY REDUCING THE INTERFACIAL BONDING STRENGTH BETWEEN SACRIFICIAL LAYER AND MEMS STRUCTURE

(75) Inventors: Minhua Lu, Mohegan Lake, NY (US); Nils D. Hoivik, Billingstad (NO); Christopher Jahnes, Upper Saddle River, NJ (US); John M. Cotte, New Fairfield, CT (US); Hongqing Zhang, Bethlehem, PA (US)

(73) Assignee: International Business Machines Corporation, Armonk, NY (US)

( * ) Notice: Subject to any disclaimer, the term of this patent is extended or adjusted under 35 U.S.C. 154(b) by 701 days.

(21) Appl. No.: 12/101,627

(22) Filed: Apr. 11, 2008

(65) Prior Publication Data
US 2009/0258455 A1 Oct. 15, 2009

(51) Int. Cl.
*H01L 21/00* (2006.01)

(52) U.S. Cl. ............ 438/52; 257/418; 257/E21.266
(58) Field of Classification Search ............ 438/52; 257/418, E21.266
See application file for complete search history.

(56) References Cited

U.S. PATENT DOCUMENTS

| | | | |
|---|---|---|---|
| 6,103,305 A | 8/2000 | Friedmann et al. | |
| 6,489,857 B2 * | 12/2002 | Petrarca et al. | 333/105 |
| 6,544,655 B1 | 4/2003 | Cabuz et al. | |
| 6,639,488 B2 | 10/2003 | Deligianni et al. | |
| 6,800,210 B2 | 10/2004 | Patel et al. | |
| 2002/0121502 A1 * | 9/2002 | Patel et al. | 216/73 |
| 2007/0138582 A1 * | 6/2007 | Nystrom et al. | 257/416 |

* cited by examiner

*Primary Examiner* — Steven J Fulk
(74) *Attorney, Agent, or Firm* — Connolly Bove Lodge & Hutz LLP; Daniel P. Morris, Esq.

(57) ABSTRACT

The beam bending of a MEMS device is minimized by reducing interfacial strength between a sacrificial layer and a MEMS structure.

11 Claims, 3 Drawing Sheets

METHOD OF MINIMIZING BEAM BENDING OF MEMS DEVICE BY REDUCING THE INTERFACIAL BONDING STRENGTH BETWEEN SACRIFICIAL LAYER AND MEMS STRUCTURE

TECHNICAL FIELD

The present disclosure relates to a MEMS (microelectromechanical) device fabrication process. More particularly, it is related to minimizing beam bending by reducing interfacial strength between a sacrificial layer and a MEMS structure.

BACKGROUND ART

A typical MEMS device is usually built on a sacrificial layer, such as organic material, $SiO_2$, diamond like carbon (DLC), or Si. The sacrificial layer is removed after processing of the MEMS structure is complete. This step in the process is typically referred to as the release process, or step. Depending on the sacrificial material used, the release process can either be a wet process, such as HF etching of $SiO_2$, or dry processes such as RIE of an organic material, or $XeF_2$ if Si is used.

MEMS structures built using multiple layers often bend after release due to a bending moment caused by the different built-in stresses of the thin films. This unintentional and undesired curvature, or bending, of a MEMS device not only changes the driving characteristics of the MEMS derives, such as flatness of micro-mirrors, pull-in voltage of actuators but may also impose a serious reliability problem. With the help of mechanical modeling, a multilayer beam MEMS device may be designed, or built up, such that the bending torques are effectively cancelled with the selection of layer thickness and stress magnitudes. For a single layer device (gyroscopes, accelerometers, resonators and the like), such an approach is typically not desired or feasible, and any stress gradients existing in the material must be carefully controlled. It has been found that a single layer $SiO_2$ cantilever beam fabricated with single-crystal Si used as sacrificial layer exhibits a curvature and bends down after the beam is released. The magnitude of the bending observed cannot be explained by the stress gradients typically occurring in a PECVD $SiO_2$ layer only. Even a well balanced multilayer beam could exhibit uncontrolled deformation when it uses Si as a sacrificial layer.

SUMMARY OF DISCLOSURE

The present disclosure is concerned with reducing the bonding strength between a MEMS structure/device and the sacrificial layer, so that the release layer has minimum effect on the mechanical properties of the beam following release. The methods of reducing the bonding strength includes, but are not limited to, the following:

One aspect of the present disclosure relates to a structure for fabricating a MEMS device which comprises the structural layer of a MEMS device, a main sacrificial layer and an additional sacrificial buffer layer located between the MEMS structural layer and main sacrificial layer, wherein the additional sacrificial buffer layer is a different material than the main sacrificial layer and has weaker bonding strength to both the sacrificial layer and MEMS structural material as compared to the bonding strength between the main sacrificial layer and MEMS structural layer.

Another aspect of the present disclosure relates to a structure for fabricating a MEMS device which comprises the structural layer of a MEMS device and a sacrificial layer wherein the sacrificial material has weak bonding strength with the MEMS structural layer of 60 $MPa/ml^{1/2}$ or less.

By way of example, it has been found according to the present invention that the bending as discussed above does not occur in $SiO_2$ beams fabricated with a DLC sacrificial layer in place of single-crystal Si.

A still further aspect of the present disclosure relates to a method for fabricating a MEMS device which comprises:

obtaining a structure that comprises the structural layer of a MEMS device, a main sacrificial layer and an additional sacrificial buffer layer located between the MEMS structural layer and main sacrificial layer, wherein the additional sacrificial buffer layer is a different material than the main sacrificial layer and has weaker bonding strength to both the sacrificial layer and MEMS structural material as compared to the bonding strength between the main sacrificial layer and MEMS structural layer, and separating the MEMS structural layer from the main sacrificial layer and additional sacrificial buffer layer to thereby provide the MEMS device.

A still further aspect of the present disclosure relates to a method for fabricating a MEMS device which comprises:

obtaining a structure which comprises the structural layer of a MEMS device and a sacrificial layer wherein the sacrificial material has weak bonding strength with the MEMS structural layer of 60 $MPa/ml^{1/2}$ or less, and separating the MEMS structural layer from the sacrificial layer to thereby provide the MEMS device.

Another aspect of the present disclosure relates to a method for fabricating a MEMS device which comprises:

obtaining a structure which comprises the structural layer of a MEMS device and a sacrificial layer, breaking or weakening the bond between the sacrificial layer and MEMS structural layer before release, and then separating the MEMS structural layer from the sacrificial layer to thereby provide the MEMS device.

The present disclosure also relates a method for fabricating a MEMS device which comprises any combination of two or more of the above disclosed methods.

Still other objects and advantages of the present disclosure will become readily apparent by those skilled in the art from the following detailed description, wherein it is shown and described preferred embodiments, simply by way of illustration of the best mode contemplated. As will be realized the disclosure is capable of other and different embodiments and its several details are capable of modifications in various obvious respects, without departing from the disclosure. Accordingly, the description is to be regarded as illustrative in nature and not as restrictive.

DETAILED DESCRIPTION OF THE PREFERRED EMBODIMENT

Figure 1:
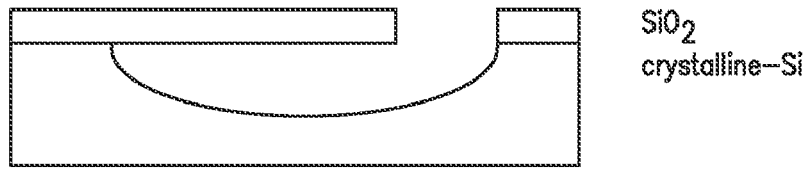
FIG. 1 is prior art with single-crystal silicon release layer
Figure 2:
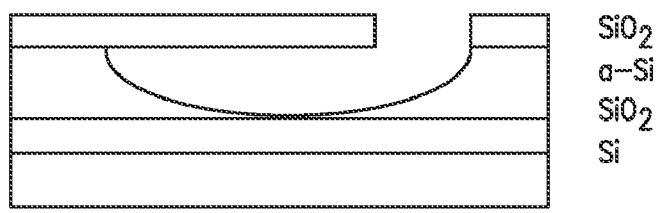
FIG. 2 is prior art with a-Si (amorphous Silicon) release layer
Figure 3:
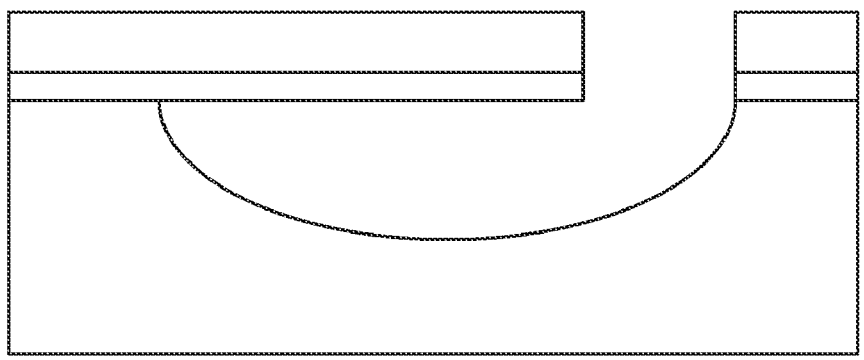
FIG. 3 illustrates a MEMS structure with a thin interfacial layer located between the beam and release layer.
Figure 4:
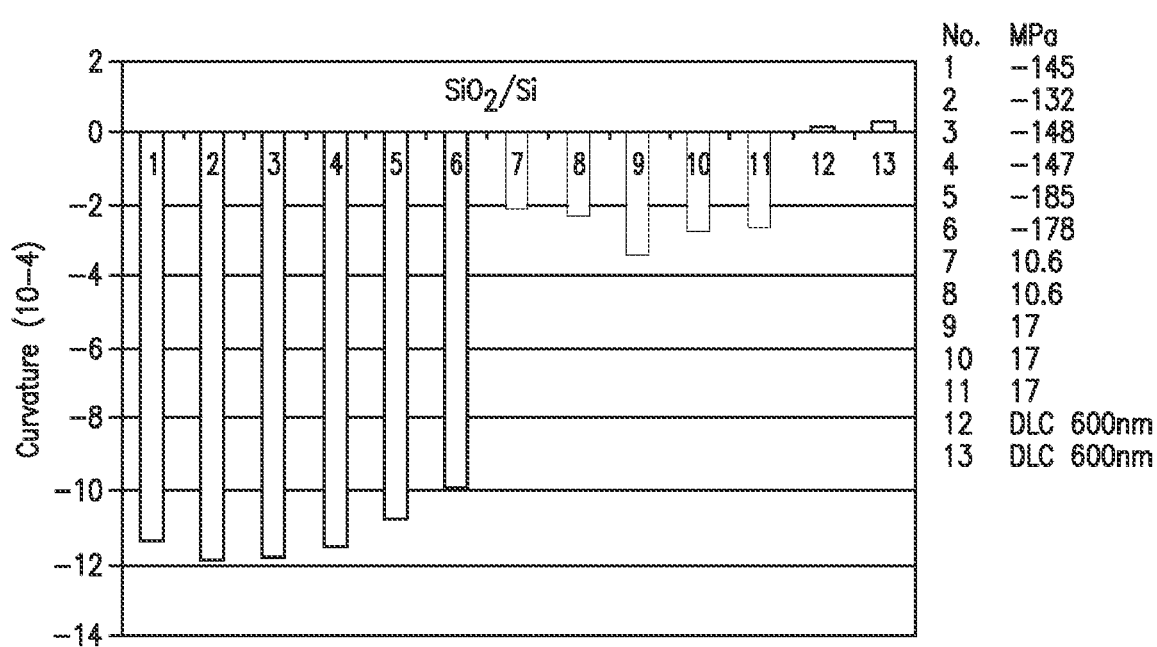
FIG. 4 is a Comparison of cantilever beam bending for $SiO_2$ single-layer structure vs. type of sacrificial layer used. The first six test cantilevers were all fabricated on single-crystalline Si sacrificial layer, whereas devices 7-11 were fabricated on amorphous Si. Sample 12 and 13, where fabricated on 600 nm DLC layer in between $SiO_2$ and Si which makes the bending curvature significantly smaller by weakening the bonding strength of the interface.
Figure 5:
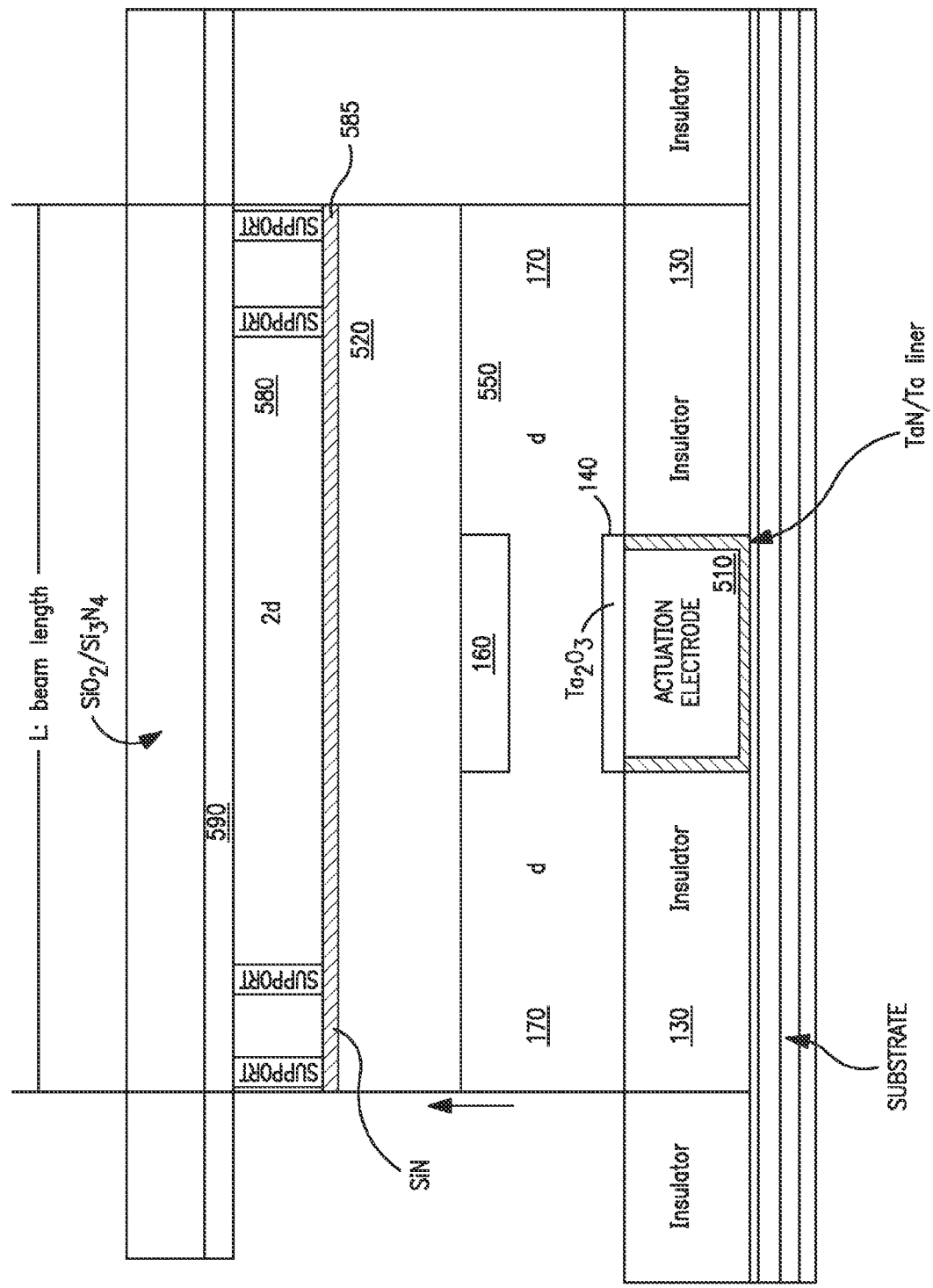
FIG. 5 is a diagram illustrating a cross-sectional view of an example of a metal-dielectric-metal MEMS switch.

A typical MEMS device is exemplified in U.S. Pat. No. 6,639,488 to Deligianni et al. and assigned to International Business Machines Corporation, the assignee of the present application. Reference to FIG. 5 shows a diagram illustrating a cross-sectional view of a metal-dielectric metal MEMS switch using CMOS metal levels and $Ta_2O_5$ (tantalum pentoxide) as dielectric material, and a top actuation electrode in a cavity. In this embodiment, lower space 550 typically defines a distance (d) from the beams 520 to bottom electrode 510. Upper space 580, from surface 585 to the top electrode 590, typically defines a distance (2d), although it is contemplated that the distance between surface 585 and top electrode 590 may be equal to distance (d), so that the distance is in the range of d to 2d. When actuated, this electrode 590 assists in releasing the beams 520 from the bottom electrode 510 by pulling up on the beams 520. The top surface of the upper space 580 may have small access holes through which release of the structure can be achieved. As a result, the top actuation electrode 590 may be perforated. Materials that can be used for this electrode are titanium nitride (TiN), tungsten (W), tantalum (Ta), tantalum nitride (TaN), or copper (Cu) cladded by tantalum nitride/tantalum (TaN/Ta). The sacrificial layer is represented by d.

During the release process of a micromachined structure, atoms of the sacrificial layer are removed from the near vicinity of the structural layer. During this process, the bond between the sacrificial layer and MEMS structural layer is broken which causes relative difference in stress-level at the bottom of the MEMS structure compared to the top portion of the structure. This difference in stress level, or stress-gradient, may be significant for devices with very strong bonding to the sacrificial layer or a cantilever, or suspended device fabricated using amorphous materials, metal or dielectric material or similar. A stress gradient will result in a bending moment. This bending moment which will cause the now suspended structure to bend or warp. The stronger the bonding strength between the sacrificial and structural layer, the larger the stress change at the bottom of the structural layer may be, and therefore the more severe deformation will occur.

According to the present disclosure the beam bending of a MEMS device is minimized by reducing interfacial strength between a sacrificial layer and a MEMS structure. This can be achieved according to the present disclosure by at least one of the techniques to be discussed below.

In particular, a structure is obtained for fabricating a MEMS device which comprises the structural layer of a MEMS device, a main sacrificial layer and an additional sacrificial buffer layer located between the MEMS structural layer and main sacrificial layer. The additional sacrificial buffer layer is a different material than the main sacrificial layer and has weaker bonding strength to both the sacrificial layer and MEMS structural material as compared to the bonding strength between the main sacrificial layer and MEMS structural layer.

The main sacrificial layer typically has a thickness of about 10 nanometers to about 50,000 nanometers, more typically about 10 nanometers to about 10,000 nanometers and even more typically about 50 to about 5,000 nanometers and the additional sacrificial buffer layer typically has a thickness of 100 nanometers or less and is thinner than the main sacrificial layer.

The additional sacrificial buffer layer typically has weak bonding strength with the MEMS structural layer and sacrificial layer of about 60 $MPa/ml^{1/2}$ or less and more typically about 20 $MPa/ml^{1/2}$ or less.

The additional sacrificial buffer layer can be deposited using techniques such as PVD, CVD, PECVD, ALD (atomic layer deposition) and spin coating.

The main sacrificial layer is typically selected from the group diamond like carbon, silicon, silicon dioxide, polyimide, photoresist, Ge or SiGe.

The sacrificial buffer layer or additional sacrificial buffer layer is typically a photoresist, polyimide or diamond like carbon.

The sacrificial buffer layer employed in particular case will be selected upon what material is used for the main sacrificial layer and/or the structural layer of the MEMS device. Such can be determined by those skilled in the art once aware of the present disclosure.

The structural layer of the MEMS device can be separated or released from the additional sacrificial buffer layer and sacrificial layer by any of the methods known in the art and need not be described herein in any detail.

For the case of a $SiO_2$ film as structural layer with Si as sacrificial layer, the $SiO_2$ and Si have a very strong bond and the bottom section of the $SiO_2$ film becomes very tensile after release and results in released cantilever beams bending down. When DLC (Diamond-Like Carbon) is used as sacrificial layer with a relatively weak bonding strength, very little distortion in $SiO_2$ beam is measured after release. The mechanism can be explained by a simple bi-layer model, where a relative tensile interfacial layer is created by the release process. The model predicts that the more the compressive the original beam is the more distortion of the released beam will result. The experimental results support the model very well.

According to another aspect of the disclosure a structure for fabricating a MEMS device is obtained which comprises the structural layer of a MEMS device and a sacrificial layer wherein the sacrificial material has weak bonding strength with the MEMS structural layer of about 60 $MPa/ml^{1/2}$ or less and more typically about 20 $MPa/ml^{1/2}$ or less.

The sacrificial layer typically has a thickness of about 10 nanometers to about 50,000 nanometers and more typically about 10 nanometers to about 10,000 nanometers.

The structural layer of the MEMS device can be separated or released from the sacrificial layer by any of the methods known in the art and need not be described herein in any detail.

The present disclosure can also be achieved by the method for fabricating a MEMS device which comprises:

obtaining a structure which comprises the structural layer of a MEMS device and a sacrificial layer or any of the above structures, breaking or weakening the bond between the sacrificial layer and MEMS structural layer before release, and then separating the MEMS structural layer from the sacrificial layer to thereby provide the MEMS device.

The bonds can be broken or weakened by implanting ions. The conditions of the ion implantation is such to induce surface damage or amorphization of the sacrificial layer. A typical ion species used is silicon. The ion implantation especially in the case of silicon is typically carried out using energy of about 1 to about 20 Kev and a dose of about $1E^{12}$ atoms/$cm^2$ to about $1E^{16}$ atoms/$cm^2$.

The structural layer of the MEMS device can be separated or released from the additional sacrificial buffer layer and sacrificial layer by any of the methods known in the art and need not be described herein in any detail.

The term "comprising" (and its grammatical variations) as used herein is used in the inclusive sense of "having" or "including" and not in the exclusive sense of "consisting only of." The terms "a", "an" and "the" as used herein are understood to encompass the plural as well as the singular.

All publications, patents and patent applications cited in this specification are herein incorporated by reference, and for any and all purpose, as if each individual publication, patent or patent application were specifically and individually indicated to be incorporated by reference. In the case of inconsistencies, the present disclosure will prevail.

The foregoing description of the disclosure illustrates and describes the present disclosure. Additionally, the disclosure shows and describes only the preferred embodiments but, as mentioned above, it is to be understood that the disclosure is capable of use in various other combinations, modifications, and environments and is capable of changes or modifications within the scope of the concept as expressed herein, commensurate with the above teachings and/or the skill or knowledge of the relevant art.

The embodiments described hereinabove are further intended to explain best modes known of practicing it and to enable others skilled in the art to utilize the disclosure in such, or other, embodiments and with the various modifications required by the particular applications or uses. Accordingly, the description is not intended to limit it to the form disclosed herein. Also, it is intended that the appended claims be construed to include alternative embodiments.

What is claimed is:

1. A method which comprises obtaining a structure that comprises the structural layer of a MEMS device, a main sacrificial layer and an additional sacrificial buffer layer located between the MEMS structural layer and main sacrificial layer, wherein the additional sacrificial buffer layer is a different material than the main sacrificial layer and has weaker bonding strength to both the sacrificial layer and MEMS structural material as compared to the bonding strength between the main sacrificial layer and MEMS structural layer,
   breaking or weakening the bond between the main sacrificial layer, additional sacrificial buffer layer and MEMS structural layer before release,
   and then separating the MEMS structural layer from the main sacrificial layer and additional sacrificial buffer layer to thereby provide the MEMS device.

2. The method according to claim 1 wherein the main sacrificial layer has a thickness of about 10 nanometers to about 50,000 nanometers and the additional sacrificial buffer layer has a thickness of 100 nanometers or less and is thinner than the main sacrificial layer.

3. The method according to claim 1 wherein the main sacrificial layer is selected from the group consisting of diamond like carbon, silicon, silicon dioxide, polyimide and photoresist.

4. The method according to claim 3 wherein the sacrificial buffer layer has a bonding strength with the MEMS structural layer and main sacrificial layer of about 60 MPa/ml$^{1/2}$ or less.

5. The method according to claim 1 wherein the additional sacrificial buffer layer has a bonding strength with the MEMS structural layer and main sacrificial layer of about 60 MPa/ml$^{1/2}$ or less.

6. The method according to claim 1 wherein the MEMS structural layer comprises $SiO_2$.

7. The method according to claim 1 wherein the main sacrificial layer is diamond like carbon.

8. The method according to claim 1 wherein the main sacrificial layer is silicon and the additional sacrificial buffer layer is diamond like carbon.

9. A method for fabricating a MEMS device which comprises:
   obtaining a structure which comprises the structural layer of a MEMS device, a main sacrificial layer and an additional sacrificial buffer layer located between the MEMS structural layer and main sacrificial layer, wherein the additional sacrificial buffer layer is a different material than the main sacrificial layer and has weaker bonding strength to both the sacrificial layer and MEMS structural material as compared to the bonding strength between the main sacrificial layer and MEMS structural layer and separating the MEMS structural layer from the main sacrificial layer and additional sacrificial buffer layer to thereby provide the MEMS device, wherein the MEMS structural layer comprises $SiO_2$.

10. A method for fabricating a MEMS device which comprises:
    obtaining a structure which comprises the structural layer of a MEMS device, a main sacrificial layer and an additional sacrificial buffer layer located between the MEMS structural layer and main sacrificial layer, wherein the additional sacrificial buffer layer is a different material than the main sacrificial layer and has weaker bonding strength to both the sacrificial layer and MEMS structural material as compared to the bonding strength between the main sacrificial layer and MEMS structural layer and separating the MEMS structural layer from the main sacrificial layer and additional sacrificial buffer layer to thereby provide the MEMS device, wherein the main sacrificial layer is diamond like carbon.

11. A method for fabricating a MEMS device which comprises:
    obtaining a structure which comprises the structural layer of a MEMS device, a main sacrificial layer and an additional sacrificial buffer layer located between the MEMS structural layer and main sacrificial layer, wherein the additional sacrificial buffer layer is a different material than the main sacrificial layer and has weaker bonding strength to both the sacrificial layer and MEMS structural material as compared to the bonding strength between the main sacrificial layer and MEMS structural layer and separating the MEMS structural layer from the main sacrificial layer and additional sacrificial buffer layer to thereby provide the MEMS device, wherein the main sacrificial layer is silicon and the additional sacrificial buffer layer is diamond like carbon.

* * * * *